US006973530B2

(12) United States Patent
Hurich

(10) Patent No.: US 6,973,530 B2
(45) Date of Patent: Dec. 6, 2005

(54) METHOD FOR WRITING AND ERASING A NON-VOLATILE MEMORY AREA

(75) Inventor: Martin Hurich, Vaihingen (DE)

(73) Assignee: Robert Bosch GmbH, Stuttgart (DE)

( * ) Notice: Subject to any disclaimer, the term of this patent is extended or adjusted under 35 U.S.C. 154(b) by 448 days.

(21) Appl. No.: 09/896,235

(22) Filed: Jun. 29, 2001

(65) Prior Publication Data

US 2002/0073408 A1   Jun. 13, 2002

(30) Foreign Application Priority Data

Jun. 30, 2000   (DE) ............................. 100 30 990

(51) Int. Cl.⁷ ............................................ G06F 12/02
(52) U.S. Cl. ...................... 711/103; 711/156; 711/170
(58) Field of Search ....................... 711/101, 103, 156, 711/170, 173

(56) References Cited

U.S. PATENT DOCUMENTS 6,144,607 A * 11/2000 Sassa .................... 365/230.03
6,154,808 A * 11/2000 Nagase et al. ............. 711/103
6,393,513 B2 * 5/2002 Estakhri et al. ............ 711/103
6,412,080 B1 * 6/2002 Fleming et al. ............. 714/15
6,453,397 B1 * 9/2002 Okuda ...................... 711/163
6,532,514 B1 * 3/2003 Haroun et al. ............. 711/103

FOREIGN PATENT DOCUMENTS

DE      43 32 499     3/1995
DE     196 19 354    11/1997

* cited by examiner

Primary Examiner—Gary Portka
(74) Attorney, Agent, or Firm—Kenyon & Kenyon

(57) ABSTRACT

A method for the writing and erasing of a non-volatile memory area, in which after error-free writing of the memory area, at least one release pattern is written into a predetermined subarea of the memory area. To be able to reliably ascertain aborted erase operations, prior to the erase operation, invalidity patterns are written into two further subareas of the memory area, the subareas provided for this enclosing those subareas reserved for the release patterns. The presence (in part) of invalidity patterns indicates an erase operation not ended correctly. The method can be used advantageously in controllers having non-volatile memories.

4 Claims, 1 Drawing Sheet

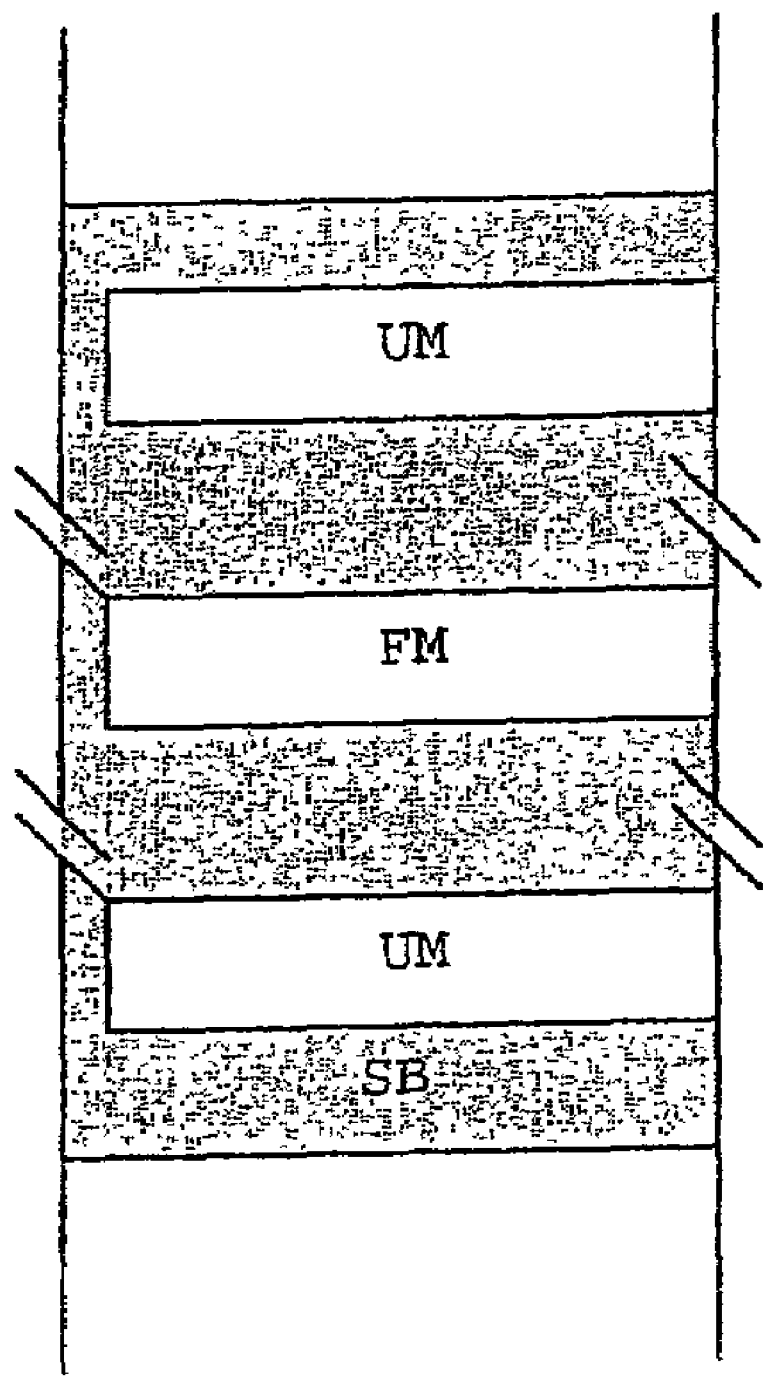
Figure

METHOD FOR WRITING AND ERASING A NON-VOLATILE MEMORY AREA

FIELD OF THE INVENTION

The present invention relates to a method for writing and erasing a non-volatile memory area, in which after error-free writing of the memory area, at least one or more release patterns are written into predetermined subareas of this memory area, and also relates to a controller having a storage device with such a non-volatile memory area.

BACKGROUND INFORMATION

A method for operating a controller having a programmable, non-volatile storage device is described in German Patent No. 196 19 354. The motor-vehicle controller described there uses an electrically erasable and programmable non-volatile storage device such as a Flash-EPROM for storing the control function programs and control function data. This type of storage device has the advantage of a high storage-location density, and can be electrically erased and reprogrammed at any time. Such modules can be initially programmed and reprogrammed by an external programming unit (e.g. a PC). The document cited proposes that, when writing a sector, to write so-called self-control data, particularly beginning markers and end markers, into certain subareas of the sector to be written. The subareas are selected such that at least one subarea is covered (acted upon) by a beginning erase operation. A properly written and thereupon not partially or completely erased sector then has intact beginning and end markers. Only in such a case is the controller with its programmable storage device put into operation for controlling the motor vehicle.

A motor-vehicle controller which is not programmed in an error-free manner or a controller whose storage device is totally or partially erased again can have a negative influence on the driveability of the motor vehicle to be controlled, such that safety risks can occur.

As described in the above-indicated document, by checking the presence of release patterns (beginning and end markers), a statement can be made as to whether the storage device written with the control programs and control data is in functional condition, and its data were not partially or completely erased again.

However, it has turned out that, particularly in the case of reprogramming as well as erasing, the known method can give no reliable evidence as to whether the respective process was carried out completely and correctly. Power fades can lead to an abnormal termination of a programming or erase operation.

On the one hand, an abortion may take place shortly before the correct termination, such that all storage locations already possess the desired contents, but some of the cells were still not programmed in a sufficiently stable manner. The check test, proposed in German Patent No. DE 43 32 499, by calculating a check sum on the memory area, cannot detect this, since only storage locations which have already failed or those having false contents can be recognized by this means. Here, the writing of release patterns into specific memory areas after successful stable programming of the storage locations can provide a remedy. On the other hand, if, for example, the erase operation began at the instant when the abnormal termination took place, it is possible that all the storage locations still possess their original contents. Neither a check test with the aid of release patterns nor a check-sum calculation will detect an error in this case. After a restart has taken place, the module reports no abnormality. Nevertheless, it is possible that the charge contents of some cells was already changed to the extent that failures can occur in the medium term.

SUMMARY OF THE INVENTION

An object of the present invention is to provide a method for writing and erasing a non-volatile memory area to be monitored, by which both the termination of a successful writing of the memory area as well as a requested erase operation can be reliably determined. The intention is also to ensure the reliable operation of a controller having a non-volatile memory area to be monitored.

According to the present invention, in addition to the release pattern, an invalidity pattern is provided as a further pattern which is written into a subarea of the memory area prior to a requested erase operation. The invalidity pattern suitably possesses a different structure than the release pattern, and marks the beginning of an erase operation, while the release pattern indicates the end of an error-free programming and storage operation. Thus, the present invention makes it possible to detect an erase operation not only negatively by changing of a release pattern, but also positively by a set invalidity pattern.

According to the present invention, when working with a non-volatile, programmable memory, at least three independently programmable subareas are kept free in the memory area to be monitored. After the conclusion of a successful programming, at least one of these subareas is filled with a release pattern. This release pattern should not correspond to the contents of an erased module in the memory area in question. Prior to a requested erase operation, an invalidity pattern is stored in each case in (at least) two further independent subareas. In this context, the two subareas for the invalidity pattern surround all subareas for release patterns, that is to say, one invalidity pattern is still located before the subarea first written with a release pattern, and a further invalidity pattern is located after the subarea of the memory area last written with a release pattern. The invalidity pattern also must not in any case correspond to the contents of an erased module.

Therefore, the invalidity patterns of the present invention mark the memory area released for erasing. In the event of a premature abortion of the erase operation, this marking is retained, so that the area in question is identified as "invalid", and a subsequent restart by readout of the memory area can even be prevented in the event that the existing release patterns remain intact.

In the case of a stochastic change of the charge-carrier contents in the storage locations during the erase operation, it can occur that the subareas which contain one of the patterns are already completely erased, while others were not yet changed. The probability that some of the storage locations between already erased storage locations are still completely unchanged is extremely low because of the type of construction of the memories mostly used (such as Flash-EPROMs).

The programming of the patterns is controlled solely by internally running routines. These routines possess integral test procedures and sequencing controls which determine the instant for the programming. Influencing of the method or manipulation of the patterns from outside, for example, by requests of a programming unit, are ruled out.

The following statements can be made about the contents of the memory area to be monitored, given the use of the method according to the present invention:

1) If none or not all of the release patterns were programmed in, then the contents of the memory area are not necessarily correct and the programming should be repeated.
2) If all the release patterns were programmed in, and if all the subareas which are reserved for invalidity patterns are still erased, then the contents of the memory area are guaranteed to be correct.
3) If at least parts of the invalidity patterns are in the subareas provided for them, then the contents of the memory area are not necessarily correct. This is an indication that an erase operation was provided or had already begun. The erase operation should then be repeated.

In summary, it can be established that, using the present invention, the state of the memory area to be monitored can be determined at every instant with maximum probability. No additional memories are needed to store the information necessary for this. It is only necessary that three independently programmable subareas be defined and reserved within the memory area to be monitored.

BRIEF DESCRIPTION OF THE DRAWING

The FIGURE shows a memory area SB to be monitored in a non-volatile, programmable memory, as well as the arrangement according to the present invention of the subareas for release patterns FM and invalidity patterns UM.

DETAILED DESCRIPTION

In the present exemplary embodiment, memory area SB to be monitored is a component of an electrically erasable and programmable non-volatile memory, in this case a Flash-EPROM. Such memories are used frequently in motor-vehicle controllers, in addition to other types of memories such as read-write memories and read-only memories. The motor-vehicle controller receives input signals from various sensors mounted on the vehicle, the input signals being used as input parameters for various control programs. The control function programs and control function data are written in the Flash-EPROM and can be rewritten accordingly in response to errors discovered later or in response to individual customer wishes. The motor-vehicle controller emits output signals, which the control program calculates and determines, to actuators.

Prior to the writing (writing in a program) of the Flash-EPROM, generally the memory area in question is erased. During the subsequent programming process, at the beginning of the area to be written, a first release pattern FM can first of all be written into the subarea reserved there. The useful data are subsequently written into the memory area provided for it; after ending this process, a further release pattern can be set at the end of the written area. Alternatively, it is also possible to work with only one release pattern, which is set in a subarea of the memory area, that in each case is covered (acted upon) immediately at the beginning of an erase operation by the erase operation. A possible subarea for a release pattern FM is shown in the FIGURE.

After the writing of the Flash-EPROM has been successfully concluded, the useful data as well as the release pattern(s) FM in the subareas provided for them are located in memory area SB. The subareas for invalidity patterns UM remain erased. A routine checks these conditions prior to the controller being put into operation and prevents a restart when one of these conditions is not met.

Prior to a requested erase operation, the first and the last of the reserved subareas in memory area SB are programmed to have an invalidity pattern UM. During the erase operation to be subsequently used, both the useful data and the release patterns, and finally the invalidity patterns are erased. The probability that both invalidity patterns are erased, but intervening storage locations are still completely unchanged is extremely low given the type of construction of the customary Flash-EPROM. Nevertheless, if, after the erase operation, at least parts of the invalidity patterns remain in the subareas provided for them, it must be assumed that the erase operation was not properly conducted to the end. The erasing should therefore be repeated.

Using the present invention, it is also possible to detect an erase operation abnormally terminated immediately after beginning, since in this case, at least parts of the invalidity pattern are already written into the subareas provided for them. Since prior to a restart of the controller, the memory area of the Flash-EPROM can be checked for the presence of the invalidity patterns, it is possible to detect such a requested, but prematurely aborted erase operation and, for the sake of safety, to prevent a restart. Without the invalidity patterns of the present invention, that is to say, on the basis of only the release patterns and/or the check-sum calculation, it would not be possible to ascertain a prematurely aborted erase operation.

In a reprogramming, the memory area should also first of all be checked for the presence of invalidity patterns whose presence supplies information that a previous erase operation was not properly conducted to the end.

By the combination of release and invalidity patterns, the present invention makes it possible to detect not only a proper writing into location, but also a utilized erasure of a memory area in a non-volatile memory. Therefore, the respective state of the memory area to be monitored can be determined with sufficient exactitude. The present invention can be easily implemented in existing systems, since it is only necessary to reserve further subareas in the existing memory area, without the existing memory being unduly restricted or additional memory being necessary.

What is claimed is:

1. A method for writing and erasing a non-volatile memory area, comprising the steps of:
   writing at least one release pattern into first predetermined subareas of the memory area, after an error-free writing of the memory area;
   providing second subareas in the memory area, the second subareas including a first marking subarea and a second marking subarea, relative to address; and
   writing into each of the second subareas with an invalidity pattern prior to an erase operation;
   wherein the first marking subarea comes before the at least one release pattern relative to address and the second marking subarea comes after the at least one release pattern relative to address.

2. The method according to claim 1, wherein the release pattern and the invalidity pattern do not correspond to contents of erased modules of the memory area.

3. The method according to claim 1, further comprising the step of, prior to reading out a written, non-volatile memory area, checking the second subareas for a presence.

4. A controller comprising:
   a storage device having a non-volatile memory area for storing control function programs and control function data, the memory area including at least one first subarea for release patterns which occupy subareas in the written memory area, the memory area further including second subareas for invalidity patterns, the second subareas including a first marking subarea and a second marking subarea of the memory area, relative to address;

wherein the first marking subarea comes before the at least one release pattern relative to address and the second marking subarea comes after the at least one release pattern relative to address.

* * * * *